United States Patent [19]

Hamasaki

[11] Patent Number: 4,801,808

[45] Date of Patent: Jan. 31, 1989

[54] ALIGNMENT AND EXPOSURE APPARATUS HAVING AN OBJECTIVE LENS SYSTEM CAPABLE OF OBSERVING A MARK ON AN EXPOSURE OPTICAL HOLDING MEMBER TO PERMIT ALIGNMENT OF A MASK RELATIVE TO THE EXPOSURE OPTICAL SYSTEM

[75] Inventor: Bunei Hamasaki, Yokohama, Japan

[73] Assignee: Canon Kabushiki Kaisha, Tokyo, Japan

[21] Appl. No.: 80,246

[22] Filed: Jul. 28, 1987

Related U.S. Application Data

[63] Continuation of Ser. No. 758,883, Jul. 25, 1985, abandoned.

[30] Foreign Application Priority Data

Jul. 27, 1984 [JP] Japan .................. 59-155513
Jul. 27, 1984 [JP] Japan .................. 59-155514

[51] Int. Cl.$^4$ ............................................. G01B 11/27
[52] U.S. Cl. .................................. 250/548; 356/401
[58] Field of Search ............... 250/548, 557; 356/399, 356/400, 401; 364/491, 559

[56] References Cited

U.S. PATENT DOCUMENTS

| | | | |
|---|---|---|---|
| 4,167,677 | 9/1979 | Suzki ..................... | 356/399 |
| 4,563,094 | 1/1986 | Yamada ................. | 356/401 |
| 4,611,122 | 9/1986 | Nakano et al. ........ | 250/548 |
| 4,655,599 | 4/1987 | Ayata et al. .......... | 356/401 |

*Primary Examiner*—Edward P. Westin
*Attorney, Agent, or Firm*—Fitzpatrick, Cella, Harper & Scinto

[57] ABSTRACT

An alignment system in an alignment and exposure apparatus for exposing a wafer to a pattern of a mask, for use in the manufacture of semiconductor devices, the alignment system including an objective lens system for observing alignment marks formed on the mask and the wafer respectively, in order to bring the mask and the wafer into a predetermined alignment relation, prior to the exposure of the wafer. The objective lens system is capable of observing a mark that is formed on a member for holding an exposure optical system in order to allow alignment of the mask relative to the exposure optical system, whereby a reference position of the objective lens system is determined on the basis of the mark formed on the holding member and whereby accurate movement of the objective lens system during movement thereof to a position for observing the alignment marks on the mask and the wafer is assured.

13 Claims, 7 Drawing Sheets

ALIGNMENT AND EXPOSURE APPARATUS HAVING AN OBJECTIVE LENS SYSTEM CAPABLE OF OBSERVING A MARK ON AN EXPOSURE OPTICAL HOLDING MEMBER TO PERMIT ALIGNMENT OF A MASK RELATIVE TO THE EXPOSURE OPTICAL SYSTEM

This application is a continuation of application Ser. No. 758,883 filed July 25, 1985, now abandoned.

FIELD OF THE INVENTION AND RELATED ART

This invention relates to an alignment and exposure apparatus and, more particularly, to an alignment and exposure apparatus for use in the manufacture of semiconductor devices, wherein, prior to exposure of a wafer to a pattern of a mask, the mask and the wafer are moved into a predetermined alignment relation while observing through an objective lens a mark formed on the mask and a mark formed on the wafer.

The manufacture of semiconductor devices such as integrated circuits includes pattern transfer steps for superposingly transferring different circuit patterns onto the same wafer in sequence. In such a pattern transfer step, a pattern which will be transferred onto the wafer must be accurately overlaid on a circuit pattern or patterns which have already been transferred onto the wafer. For this reason, in the pattern transfer step, it is necessary to achieve exact alignment between the wafer and a photomask or reticle (which hereinafter will be referred to simply as "mask") having a pattern which will be transferred onto the wafer. Such mask-to-wafer alignment is usually carried out by photoelectrically detecting alignment marks formed on the mask and the wafer, respectively. On the basis of electrical signals obtained by the photoelectric detection, the mask and the wafer are aligned with each other automatically.

In another aspect, when the pattern of the mask is to be transferred onto the wafer with the use of a projection optical system, it is also necessary to hold the mask in alignment with a position which is preset relative to the projection optical system. Usually, such mask alignment is carried out in a similar manner as the mask-to-wafer alignment, i.e. by photoelectrically detecting a mask alignment mark formed on the mask and another mask alignment mark formed on such member that holds the projection optical system, e.g. a barrel of the projection optical system.

In order to achieve the above-described mask-to-wafer alignment or the mask alignment, an optical system is required which is capable of observing, simultaneously, separate alignment marks formed respectively on separate objects or members to be aligned with each other. However, on one hand, the position at which the alignment mark is formed is variable, depending on the situation on the user's side of the exposure apparatus. On the other hand, it may be desired to design the observation optical system so as to allow observation of any other object, as well as the observation of the alignment marks. Further, it is desirable that both the mask-to-wafer alignment and the mask alignment can be attained with use of the same observation optical system. For these reasons, it is very desirable to provide the observation optical system with an objective lens system having a wide movable range, which substantially leads to an enlargement of the view field of the observation optical system. In order to allow movement of the objective lens system through a wider range, however, a high-accuracy positional reproducibility is strictly required for the movement of the objective lens system.

SUMMARY OF THE INVENTION

It is accordingly a primary object of the present invention to provide an alignment system for aligning two objects with each other, in which system alignment marks formed on the two objects respectively are observed by an objective lens system and in which the objective lens system has a wider movable range and yet has a high-accuracy positional reproducibility. It is another object of the present invention to provide an alignment system suitable for use in an alignment and exposure apparatus for exposing a wafer to a pattern of a mask in the manufacture of semiconductor devices.

Briefly, according to the present invention, there is provided an alignment system in an alignment and exposure apparatus for exposing a wafer to a pattern of a mask, for use in the manufacture of semiconductor devices, the alignment system including an objective lens system for observing alignment marks formed on the mask and the wafer respectively, in order to bring the mask and the wafer into a predetermined alignment relation, prior to the exposure of the wafer. The objective lens system is capable of observing a mark that is formed on a member for holding an exposure optical system in order to allow alignment of the mask relative to the exposure optical system, whereby a reference position of the objective lens system is determined on the basis of the mark formed on the holding member and whereby accurate movement of the objective lens system during movement thereof to a position for observing the alignment marks on the mask and the wafer is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
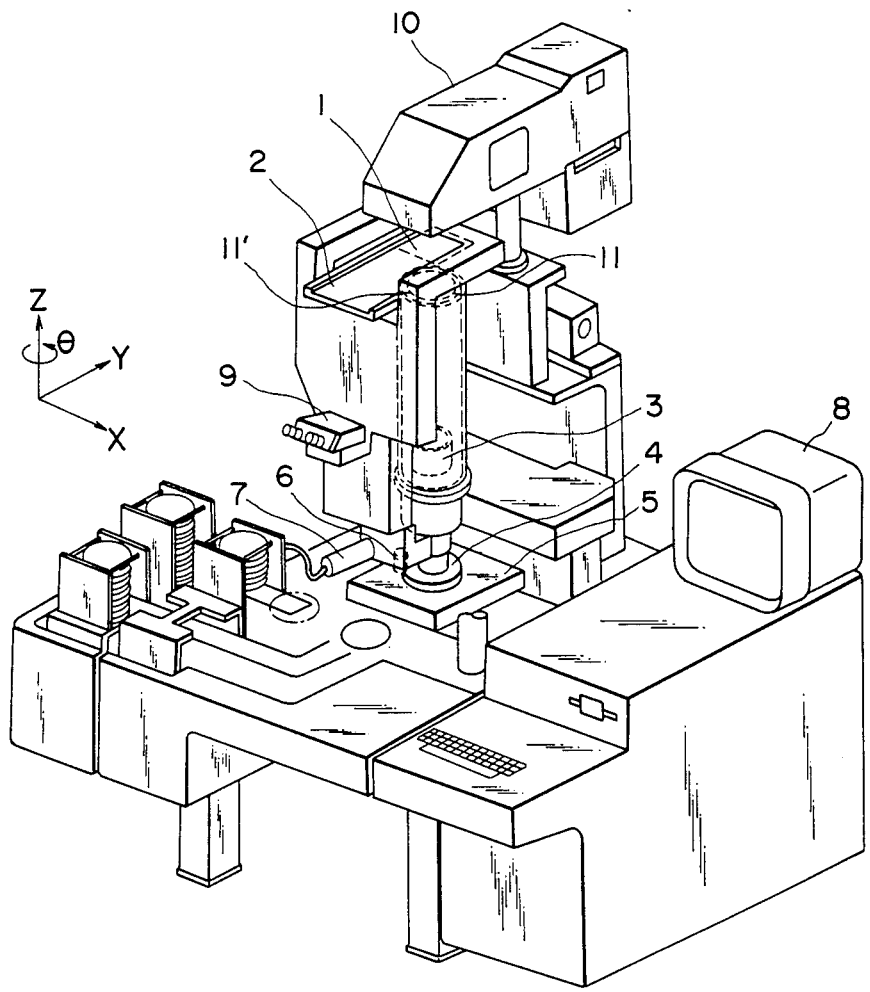
FIG. 1 is a perspective view of an alignment and exposure apparatus into which an alignment system according to an embodiment of the present invention is incorporated.

Referring first to FIG. 1, an alignment and exposure apparatus into which an alignment system according to one embodiment of the present invention is incorporated will now be described.

A mask 1 has formed thereon a pattern of an integrated circuit as well as mask alignment marks and mask-to-wafer alignment marks. The mask 1 is held by a mask stage 2 such that the mask can be translated (in X and Y directions) and rotated (in $\theta$ direction) in a plane. The exposure apparatus further includes a reduction projection lens 3, and a wafer stage 5 for holding a wafer 4 such that it can be translated and rotated in a plane, like the mask 1. The wafer 4 has a photosensitive layer on which mask-to-wafer alignment marks and a TV wafer alignment mark are formed. The wafer stage 5 is also adapted to move between a wafer exposure position (in the field of projection) and a TV wafer alignment position. The apparatus further includes an objective lens 6 for a TV wafer alignment, an image pickup tube or solid-stage image pickup element 7, a TV receiver 8 for observing images, a binocular unit 9 used to observe the surface of the wafer 4 through the projection lens 3, an upper unit 10 containing an illumination optical system for converging light from a source of light onto the mask to illuminate it, and also containing a mask-to-wafer alignment detecting system.

The wafer stage receives the wafer 4 from a wafer transport system (not shown) and holds it at a predetermined position thereon. The wafer stage 5 is then moved to a position in which the TV wafer alignment mark on the wafer 4 enters the field of view in the TV wafer alignment objective lens 6. This positional accuracy depends on the precision of the mechanical alignment. The field of view in the objective lens 6 is of a diameter in the order of one to two millimeters. If the alignment mark enters this field of view, it is detected by the image pickup tube 7 with the coordinate position thereof being sensed relative to a TV wafer alignment reference mark which is preparatively provided in a TV wafer alignment optical system. Since the position of the above TV wafer alignment reference mark and the position for the mask-to-wafer alignment detection are preset and since the positional relation between the TV wafer alignment mark and the mask-to-wafer alignment marks, all of which are formed on the wafer 4, is predetermined, the amount of feed of the wafer stage 5 to the mask-to-wafer alignment detection position can be determined on the basis of the above preset two positions and the detected coordinate position of the TV wafer alignment mark. The detected precision of the TV wafer alignment mark is ±5 microns or less, and of the order of ±10 microns even in consideration of any error which might be produced when the wafer stage 5 is moved from the TV wafer alignment position to a mask-to-wafer alignment position. Therefore, the fine alignment (i.e. the mask-to-wafer alignment) may be made within the range of about ±10 microns which is one-hundredth or less of the field of view in the conventional alignment operation. As a result, the mask-to-wafer alignment can be made with a higher speed.

Figure 2:
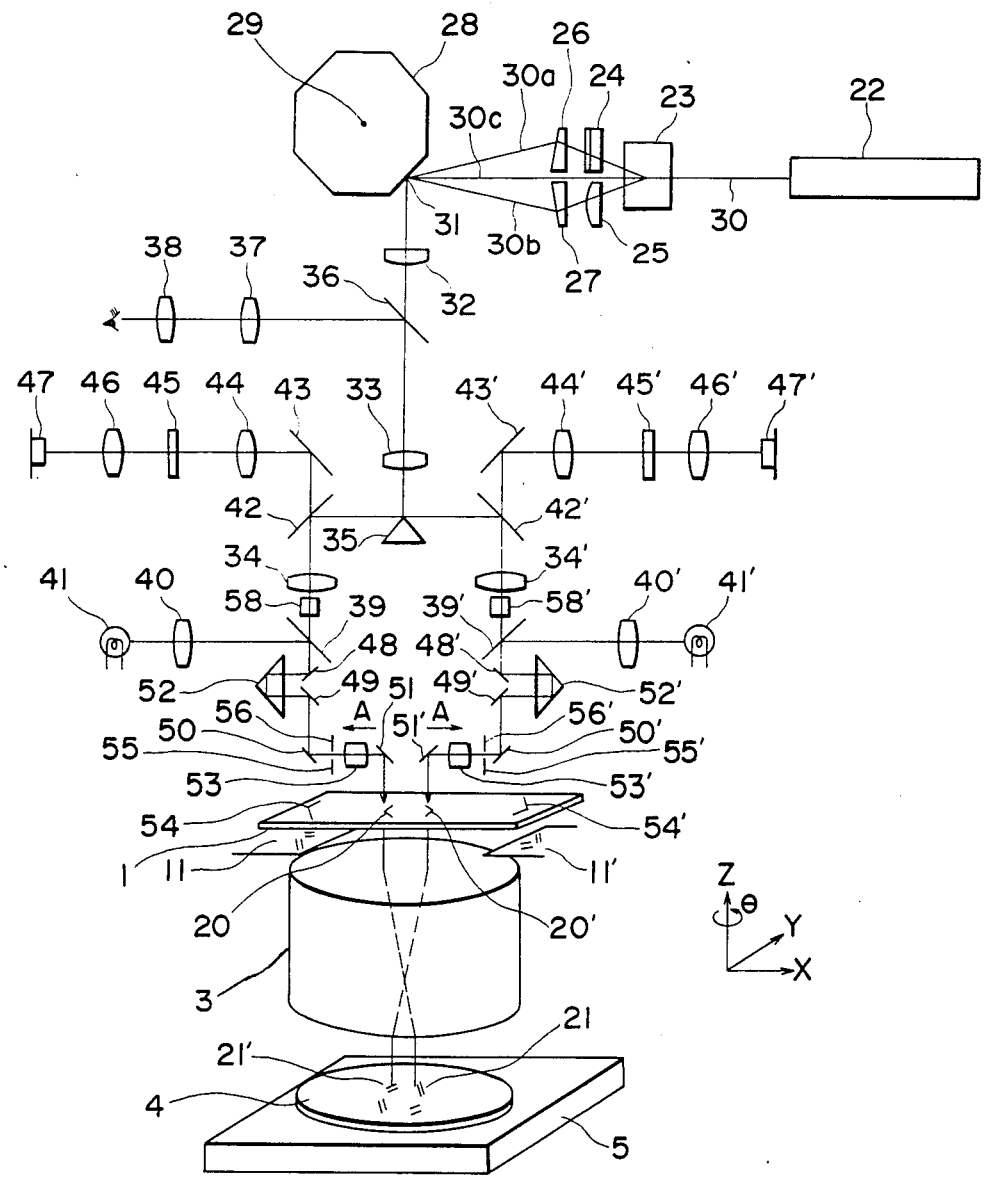
FIG. 2 is a schematic view showing an alignment system according to one embodiment of the present invention and applied to the alignment and exposure apparatus of FIG. 1.

FIG. 2 shows details of the alignment system for achieving the mask alignment and the mask-to-wafer alignment. In this FIGURE, the projection lens 3 is schematically depicted for convenience.

Figure 3A:
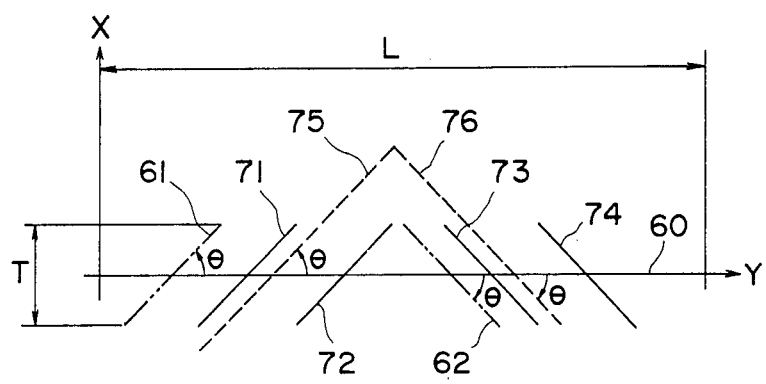
FIGS. 3A an 3B show the state of alignment marks upon completion of mask-to-wafer alignment and alignment signals obtainable at this time.

The mask 1 has two mask-to-wafer alignment marks 20 and 20' each of which is formed by the straight lines of slits such as at 75 and 76 shown in FIG. 3A. As shown in this Figure, these mark elements 75 and 76 are inclined relative to a scanning line 60 by an angle of 45 degrees. On the other hand, the wafer 4 has two mask-to-wafer alignment marks 21 and 21' each of which is formed by four straight line or slits 71-74 shown in FIG. 3A. These mark elements 71-74 are inclined relative to the scanning line 60 by an angle of 45 degrees. Normally, the mask-to-wafer alignment is made on the basis of the signals obtainable from the right-hand and left-hand mask-to-wafer alignment marks 20, 21; 20', 21'.

The alignment marks on the mask 1 and wafer 4 are sized such that they will have no dimensional variation when projected or inversely projected through an optical system other than a one-to-one projection system. In the illustrated embodiment, the value obtained by dividing the size of each alignment mark 21 or 21' on the wafer 4 by the size of each alignment mark 20 or 20' on the mask 1 is equal to the reduction ratio of the projection lens 3.

Turning back to FIG. 2, the alignment system includes a source of laser beam 22 and an optical deflector 23 which is in the form of an acoustooptic element or the like. The deflector 23 is arranged to change its light emitting orientation between three directions, upward, horizontal and downward by the use of external signals. The alignment system further includes converging cylindrical lenses 24 and 25 having the respective generating lines intersecting at a right angle. Each of the cylindrical lenses is adapted to convert the cross sectional configuration of the laser beam into a linear shape. There are provided trapezoid prisms 26 and 27 each of which is effective to reversely refract the beam that has been upwardly or downwardly deflected by the deflector 23. A polygonal mirror 28 is rotatable about a rotating shaft 29.

Depending on the state of the deflector 23, the laser beam 30 emitted from the source 22 forms a slit-like beam 30a passing through the cylindrical lens 24 and prism 26, a slit-like beam 30b passing through the cylindrical lens 25 and prism 27 or a spot-like beam 30c straight running without passing through any cylindrical lens and prism. In any event, the laser beam converges on a point 31 on the face of the polygonal mirror 28. The system further includes intermediate lenses 32, 33 and 34, an optical path dividing mirror 35, a half-mirror 36 for conducting the beam to a visual observation system (37 and 38), a field lens 37, an eyepiece 38 for transmitting the image of the wafer to the human eye, a half-mirror 39 for defining an illumination system (40, 41), a condenser lens 40, an illumination lamp 41, a half mirror 42 for defining a photoelectric detection system (43, 44, 45 and 46), an optical path deflecting mirror 43, a lens 44, a spatial filter 45, a condenser lens 46, a photosensor 47, total reflection mirrors 48, 49, 50 and 51, a prism 52, an f-$\theta$ objective lens 53 and a prism block 58 for converting the laser beam scan in the plane of the sheet of the drawing (i.e., in the X direction) into a laser beam scan in a direction perpendicular to the sheet of the drawing (in the Y direction).

As seen from FIG. 2, the signal detection system consists of two symmetrical sections, the right-hand section having parts shown by numerals with primes and the left-hand section having parts shown by numerals without primes, as viewed by an operator positioned above the drawing.

On a stationary portion of the exposure apparatus, such as a barrel of the projection lens 3 or a part of the frame of the apparatus, there are provided two mask reference marks 11 an 11' which are used, in the first place, for the mask alignment. On the other hand, the mask 1 is provided with corresponding mask alignment marks 54 and 54'.

The intermediate lenses 32, 33 and 34 (34') are arranged to define an origin of deflection of the polygonal mirror 28 in a pupil 56 (56') at an aperture stop 55 (55') of the objective lens 53 (53'). Thus, the laser beam scans the mask 1 and wafer 4 in the Y direction as the polygonal mirror 28 is rotated.

In the objective lens system, the objective lens 53 (53'), aperture 55 (55'), mirror 51 (51') and prism 52 (52') are movable in the directions X and Y by driving means (not shown) so that the observation and measurement positions of the mask 1 and wafer 4 can freely be changed. For example, the movement in the direction X is made as the mirror 51 (51') is moved in the direction shown by an arrow A in FIG. 2, while the objective lens 53 (53') and aperture 55 (55') are similarly moved in the direction A. Also, the prism 52 (52') is moved in the direction A by one-half the movement of the mirror 51 (51') to maintain the optical path length constant.

In the direction Y, both the left-hand and right-hand observation optical systems each for observation and position detection are moved as a unit in the Y direction.

Figure 3B:
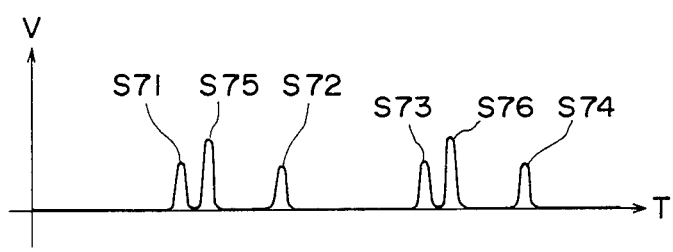

Referring to FIG. 3A, a linear or slit like scanning beam 61 which has passed through the cylindrical lens 24 is inclined relative to the scanning axis 60 by an angle of 45 degrees and substantially parallel to the mark elements 71, 72 and 75. If the scan is made in such condition, each of the photosensors 47 and 47' generates signals S71, S75 and S72 as shown in FIG. 3B. These signals S71, S75 and S72 correspond to the alignment mark elements 71, 75 and 72, respectively. Even if there is any fine external matter on the scanned surface, it will not be detected in practice since the outputs of the sensors are averaged, and compared with the detection with a spot-like beam.

On the other hand, a scanning beam 62 which has passed through the cylindrical lens 25 is inclined relative to the scanning axis 60 by an angle of 45 degrees, but in a opposite direction( to the scan beam 61, and is substantially parallel to the mark elements 73, 74 and 76. As a result, each of the sensors 47 and 47' generates signals S73, S76 and S74 as shown in FIG. 3B. By measuring the intervals between the signals S71, S75, S72, S73, S76 and S74, any deviation between the mask and wafer can be determined. If the mask and wafer are properly aligned with each other, the spacings between the detection signals are equal to one another.

Details of such process of alignment are described in, e.g., U.S. Pat. No. 4,165,149 issued Aug. 21, 1979 and U.S. Pat. No. 4,167,677 issued Sept. 11, 1979.

While the description has been made, with reference to FIGS. 2 and 3, to the mask-to-wafer alignment using the mask-to-wafer alignment marks formed on the mask 1 and the wafer 4, the same optical arrangement as described in the foregoing can be used also to achieve the mask alignment in a similar manner. That is, by detecting the mask alignment marks 54 and 54' formed on the mask 1 and the mask reference marks 11 and 11' carried by a stationary portion such as the barrel of the projection lens 3, the position of the mask relative to the projection lens can be detected. On the basis of the result of detection, the mask 1 is relatively moved so as to be in alignment with the reference as represented by the mask reference marks 11 and 11'.

In order to allow the same optical arrangement to execute both the mask-to-wafer alignment and the mask alignment, it is necessary that, as described in the foregoing, each of the two objective lens systems composed of the objective lenses 53 (53'), pupils 55 (55'), mirrors 51 (51'), prisms 52 (52'), etc., is moved to a position of corresponding to one of the mask reference marks 11 and 11' in the direction A.

Where the objective lens system is to be moved as above, it is desired to accurately determine a reference position for the objective lens system upon the start of the operation of the apparatus, in order to assure a high-accuracy positional reproducibility after movement. According to the present invention, such a reference position for the objective lens system can be determined in a unique and simple manner. This determination of the reference position for the objective lens system will now be described as "objective" alignment. Briefly, according to one embodiment of the present invention which will now be described in the following, a reference position for the objective lens is preset and the objective lens system is moved toward this reference position. Then, any positional deviation of the objective lens system with respect to the reference position is measured. On the basis of the result of measurement, the position of the objective lens system is adjusted.

Figure 4:
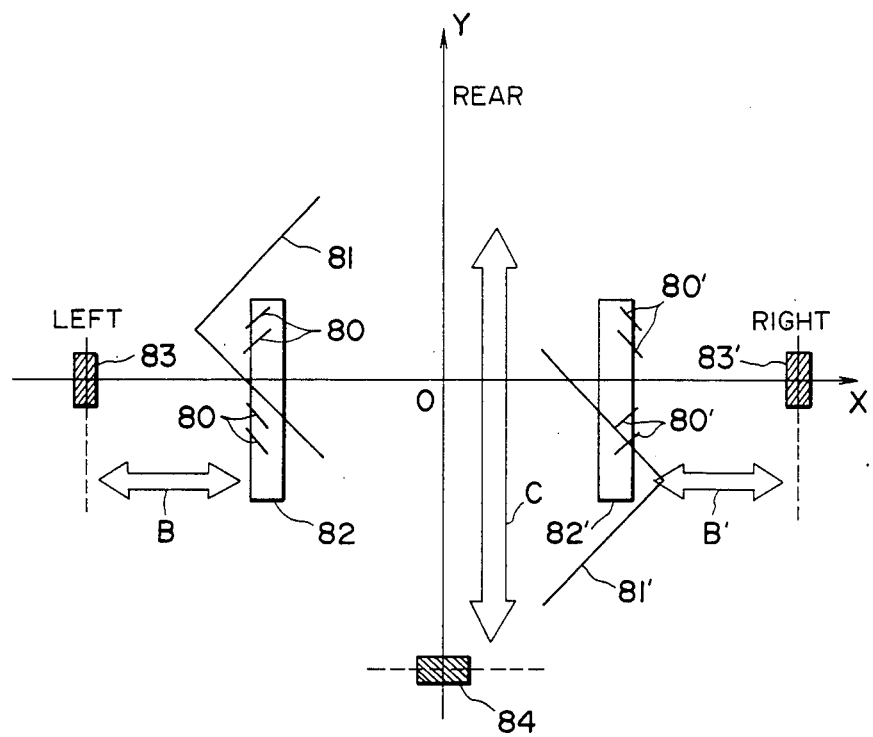
FIG. 4 is a schematic view showing the positional relation between the major elements of the alignment system according to one embodiment of the present invention.

FIG. 4 is a schematic plan view showing the positional relation between the elements for the "objective" alignment, as viewed from above. In this Figure, the direction toward the rear of the exposure apparatus is in the positive Y direction, the direction toward the right-hand side of the apparatus (as viewed in FIG. 2) is in the positive X direction. Denoted at 80 and 80' in FIG. 4 are the mask reference marks corresponding to those shown at 11 and 11' in FIG. 2. Also, denoted at 81 and 81' in FIG. 4 are the mask alignment marks, formed on the mask 1, corresponding to those shown at 54 and 54' in FIG. 2.

In FIG. 4, the left-hand side objective lens system is schematically shown by a reference numeral 82, the oblong block representing the view-field of the objective lens system (which corresponds to the scanning area of the laser beam), while the right-hand side objective lens system is similarly and schematically shown by a reference numeral 82'.

As described in the foregoing, these objective lens systems are movable in the direction X, independently from each other, as shown by arrows B and B' in FIG. 4. With respect to the movement in the Y direction, the entire optical arrangement is movable as a unit in a direction shown by an arrow C in FIG. 4. Thus, three kinds of driving systems are contained and therefore three initial positions are involved. Since the positioning operations for these driving systems are the same in essence as each other, only one, the initial positioning of the driving system for moving the objective lens system 82 in the X direction will now be described.

The exposure apparatus is provided with photo-interruptors 83, 83' and 84 which are fixedly disposed at appropriate positions, respectively. These photo-interruptors are provided for the sake of initial positioning of the left-hand side X driving system, the right-hand side X driving system and the Y driving system, respectively.

A sequence is preparatively programmed such that, upon start of the operation of the apparatus and upon resetting of the apparatus, the left-hand side objective lens system 82 is moved by an unshown actuator toward the photo-interruptor 83. The objective lens system 82 is formed with a sheet-like member (not shown) which is movable with the objective lens system 82. When, during movement of the objective lens system 82, the sheet-like member intercepts the photo-interruptor 83, the actuation by the unshown actuator is ceased in response thereto so that the objective lens system 82 is stopped accordingly. However, the stop position of the objective lens system 82 determined by the photo-interruptor 83 is variable and, depending on the response characteristics of the photo-interruptor, the maximum 50 microns variations are shown. Each time, the operation of the apparatus is started and each time the apparatus is reset, such positional variations are caused. This is a serious problem because it may cause incorrect mask alignment or mask-to-wafer alignment, or, in the worst case, it makes the alignment impossible.

Such problem is eliminated by the present invention. In this embodiment of the present invention, the "objective" alignment is carried out by detecting, through the objective lens system itself, a reference mark formed on a stationary portion of the apparatus, such as a barrel of the projection lens or a portion of the frame of the apparatus. Particularly, in this embodiment of the present invention, the mask reference marks 81 and 81' (FIG. 4) used for the sake of the mask alignment are used also as the reference marks for the "objective" alignment. However, the reference marks for the "objective" alignment may be ones separate from the mask reference marks 81 and 81', formed at different positions as the mask alignment reference marks, and further, they may be of different shape as that of a mask alignment reference mark.

After the objective lens system 82 (82') is initially positioned by the photo-interruptor 83 (83', 84), the mask 1 is transported to the mask stage 2 by an unshown mask changing mechanism and the mask 1 is held by the mask stage 2. The positioning of the mask 1 at that time is effected mechanically, so that the positioning accuracy is not so high, containing a positional error of an order of several hundreds of microns. If, therefore, the field of the objective lens 82 (82') is narrow and if the objective lens 82 (82') is moved from its initially set position to a position for observing the mask alignment mark 81 (81') formed on the mask 1, this mask alignment mark 81 (81') can not always be caught by the field of the objective lens 82 (82') which field corresponds to the scan area by the laser beam. As compared therewith, the distance from the position of the photo-interrupter 83 (83', 84) to the position of the mask reference mark 80 (80') carried by the stationary portion of the apparatus is absolutely determined only by the accuracy of the assembly of the apparatus, so that any error contained is sufficiently small and can be neglected. Therefore, when the objective lens 82 (82') is moved from its initially set position to a position for observing the mask reference mark 80 (80'), this mask reference mark can be well caught by the field of the objective lens 82 (82'), irrespective of the lower-accuracy initial positioning of the objective lens 82 (82') by the photo-interruptor 83 (83', 84).

Accordingly, in this embodiment of the present invention, the objective lens 82 (82'), after completion of its initial positioning, is moved aiming at the mask reference mark 80 (80') carried by the stationary portion of the apparatus. Then, the mask reference mark 80 (80') is scanned by the laser beam in a manner similar to that described with reference to FIGS. 2 and 3, and the distance from the scan start point to the mask reference mark and the intervals between the elements of the mask reference mark are measured. On the basis of the results of measurement, the position of the objective lens system 82 (82') is controlled, whereby the objective lens system 82 (82') is positioned relative to the mask reference mark 80 (80'). Thus, the "objective" alignment is completed. In other words, the reference position of the objective lens system is determined with a high accuracy. Details of the above measurement will be described later.

It will be understood that, in some cases, when the objective lens system 82 (82') reaches the position for detecting the mask reference mark 80 (80'), the mask alignment mark 81 (81') formed on the mask 1 also comes within the field of the objective lens system 82 (82'), as illustrated in FIG. 4. If, in such case, the mask reference mark 80 (80') and the mask alignment mark 81 (81') are located in the positional relation as shown in FIG. 4, it will not be possible to distinguish those of the electrical signals, obtained by the laser beam scan, corresponding to the mask reference mark 80 (80') from those of the electrical signals corresponding to the mask alignment mark 81 (81').

This can be obviated in two ways:

(1) The mask stage 2 can be moved so that the mask alignment mark 81 (81') goes fully out of the field of the objective lens system 82 (82') so that only output signals corresponding to the mask reference mark 80 (80') are detectable.

(2) The objective lens system 82 (82') is moved to search the mask alignment mark 81 (81') with this objective lens system, until the position of the mask alignment mark is detected precisely. Then, the mask alignment is carried out in a similar manner as described with reference to FIG. 2. By this, the positional relation or the distinction between output signals corresponding to the mask alignment mark 81 (81') and output signals corresponding to the mask reference mark 80 (80') can be detected. It is to be noted that, at the time of such mask alignment as described above, the "objective" alignment is not yet effected.

To allow the "objective" alignment, either of the above two processes may be adopted. Since the manner of the "objective" alignment is not essentially affected by whether the first-mentioned process or the second-mentioned process is selected, a description will now be provided of a case where the second-mentioned process is effected.

For better understanding, it is now assumed that both the mask alignment and the "objective" alignment have already been attained, so that the objective lens system 82 (82') has been correctly positioned relative to the mask reference mark 80 (80') with which the mask alignment mark 81 (81') has been aligned.

While various geometrical designs are adoptable for the mask side alignment marks for the mask alignment (i.e. the mask alignment marks) and for the alignment marks on the apparatus side (i.e. the mask reference marks), this embodiment of the present invention employs such alignment marks each having bar-like mark elements, as described in the foregoing, which are inclined at an angle 45 degrees relative to the laser beam scan line (60 in FIG. 5A), similar to the mask-to-wafer alignment marks shown in FIG. 3A. More particularly, the mask alignment mark 81 (81') is provided by two bar-like elements 75 and 76 (see FIG. 5A) which are joined with each other at a right angle and are inclined, oppositely, at an angle 45 degrees relative to the scan line 60. On the other hand, the mask reference mark 80 (80') is formed by two pairs of oppositely inclined bar-like elements 71, 72; 73, 74, the mark elements in each pair being parallel to each other and being inclined at an angle 45 degrees relative to the scan line 60.

These alignment marks are designed such that, upon completion of the mask alignment, the mark element 75 is positioned between the mark elements 71 and 72 while the mark element 76 is positioned between the mark elements 73 and 74, that each bar-like element intersects with the scan line 60 with an exact angle of 45 degrees and that the interval, in the direction of scan, between the elements 71 and 75, the interval between the elements 75 and 72, the interval between the elements 73 and 76 and the interval between the elements 76 and 74 are equal to each other. Further, in this embodiment, the reference position of the objective lens system 82 (82') is set such that, when it is established, the scanning laser beam passes or intersects each of the mask reference mark elements 71–74 at exactly the middle point of each mark element with respect to the length thereof.

Figure 5A:
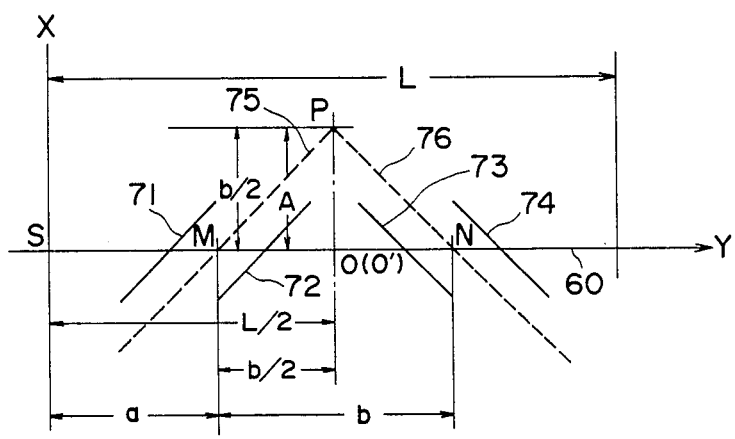
FIGS. 5A and 5B show the state of the alignment marks upon completion of the alignment of an objective lens system, in accordance with one embodiment of the present invention, and the detection signals obtainable at that time.
Figure 5B:
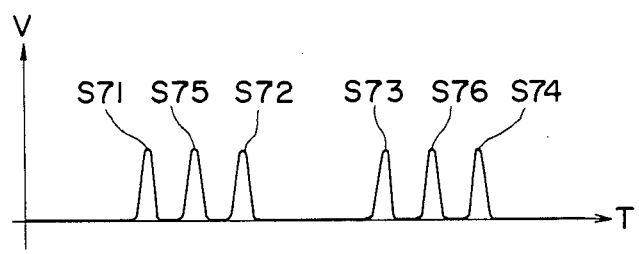

The scan beam 60 starts scanning from the scan start point S and scans the mask reference mark elements 71, 72, 73 and 74 and the mask alignment mark elements 75 and 76. The length of scan is denoted by L in FIG. 5A. Electrical signals obtainable from such scanning by the laser beam are shown in FIG. 5B. It is seen from this Figure that there are produced not only such output signals S71, S72, S73 and S74 that correspond to the mask reference mark elements 71–74, but also such outut signals S75 and S76 that correspond to the mask alignment mark elements 75 and 76. Since, as described above, the mask alignment has been achieved, the position, with respect to time, of the output signal S75 is between the positions of the output signals S71 and S72, while the position of the output signal S76 is between the positions of the output signals S73 and S74. If, therefore, of the six output signals, the second signal and the fifth signals are neglected, only those output signals which correspond to the mask reference mark elements 71–74, respectively, can be recognized, as in the case where only the mask reference mark is caught by the field of the objective lens system 82 (82'). Accordingly, the "objective" alignment can be achieved on the basis of the thus detected mask reference mark elements.

More specifically, if the mask reference mark is detected, then the position of the objective lens system 82 (82') relative to the thus detected mask reference mark (which is formed on the stationary portion of the apparatus) can be detected. For example, when the laser beam scanning is completed, the distance of each of the output signals from the scan start point S can be detected. In FIG. 5A, reference character M denotes an average of the distance from the position S to the position S71 and the distance from the position S to the position S72, while reference character b denotes a value obtained by subtracting the average distance M from an average of the distance from the position S to the position S73 and the distance from the position S to the position S74. If the mask alignment has been completed, then the distance a may be considered as being apparently corresponding to the distance from the position S to the position of the output signal S75 related to the mask alignment mark element 75, whereas the distance b may be considered as being apparently corresponding to a value obtainable by subtracting the average distance M from the distance from the position S to the position of the output signal S76 related to the mask alignment mark element 76. It follows from this that:

$$a = SM$$

$$b = MN$$

where M is the point at which the scanning beam 60 intersects with the mask alignment mark element 75 (it is existing where the mask alignment has been completed, whereas it is phantom where the mask alignment mark has gone out of the field of the objective lens system); N is the point at which the scanning beam 60 intersects with the mask alignment mark element 76 (it is existing where the mask alignment has been completed, whereas it is phantom where the mask alignment mark has gone out of the field of the objective lens system).

In FIG. 5A, reference character A is a distance from a center O of the mask reference mark elements 72 and 73 (the middle point of a line connecting the middle points of the mark elements 72 and 73 in the lengths thereof) to an apex P defined by the mask alignment mark elements 75 and 76 (the point P is existing in the case where the mask alignment has been completed, whereas it is phantom where the mask alignment mark has gone out of the field of the objective lens system). The distance A is a constant which is determined by the shape and size of the mask reference mark and the mask alignment mark. When the objective lens system 82 (82') is in alignment with the mask reference mark, i.e. when the objective lens system 82 (82') is correctly positioned relative to the mask reference mark elements 71–74, the center of the objective lens system 82 (82') which corresponds to the center O' of the scanning beam 60 is exactly coincident with the center O of the mask reference mark elements 72 and 73 as described hereinbefore. Therefore, in FIG. 5A, the following conditions are satisfied:

$$a + b/2 = L/2 \qquad (1)$$

$$b/2 = A \qquad (2)$$

The values of L and A are predetermined and known, whereas the values a and b are those to be measured. Thus, if such a relation as defined by the above conditions (1) and (2) is satisfied between the known values L and A and the measurement results a and b obtainable from the signals S71–S74, it shows that the objective lens system 82 (82') is in alignment with the reference position as defined by the mask reference mark.

Figure 6A:
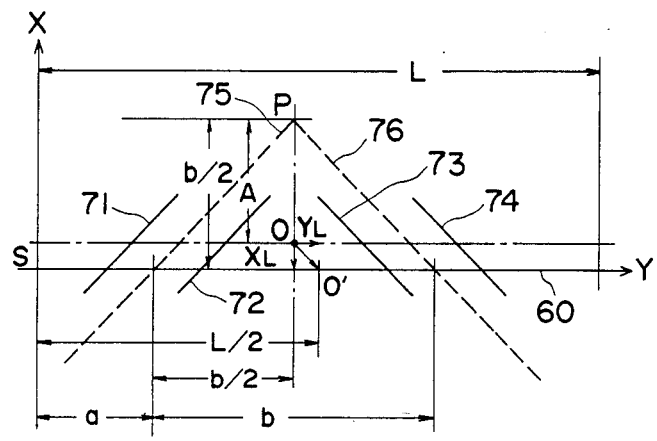
FIGS. 6A and 6B show the state of alignment marks, when the alignment of the objective lens system is not completed, and the detection signals obtainable at that time.
Figure 6B:
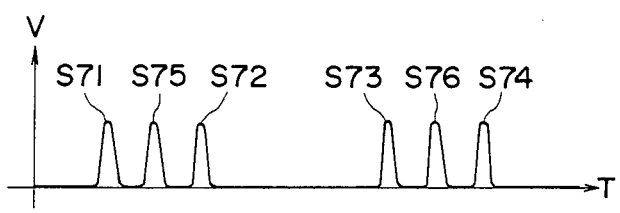

FIG. 6A shows a case where the objective lens system 82 (82') is not correctly positioned relative to the mask reference mark, although the mask alignment has already been completed. Output signals obtainable from the alignment marks in such case are shown in FIG. 6B. In FIGS. 6A and 6B, the same reference numerals and characters are assigned to the portions corresponding to those of FIGS. 5A and 5B.

In FIG. 6A, the center of the objective lens system 82 (82') as denoted by O' is deviated from the center O of the mask reference mark elements 72 and 73 by an amount XL in the X direction and by an amount YL in the Y direction. In such case, the amounts of deviations XL and YL can be derived from the following equations:

$$XL = b/2 - A \quad (3)$$

$$YL = L/2 - (a + b/2) \quad (4)$$

Figure 7:
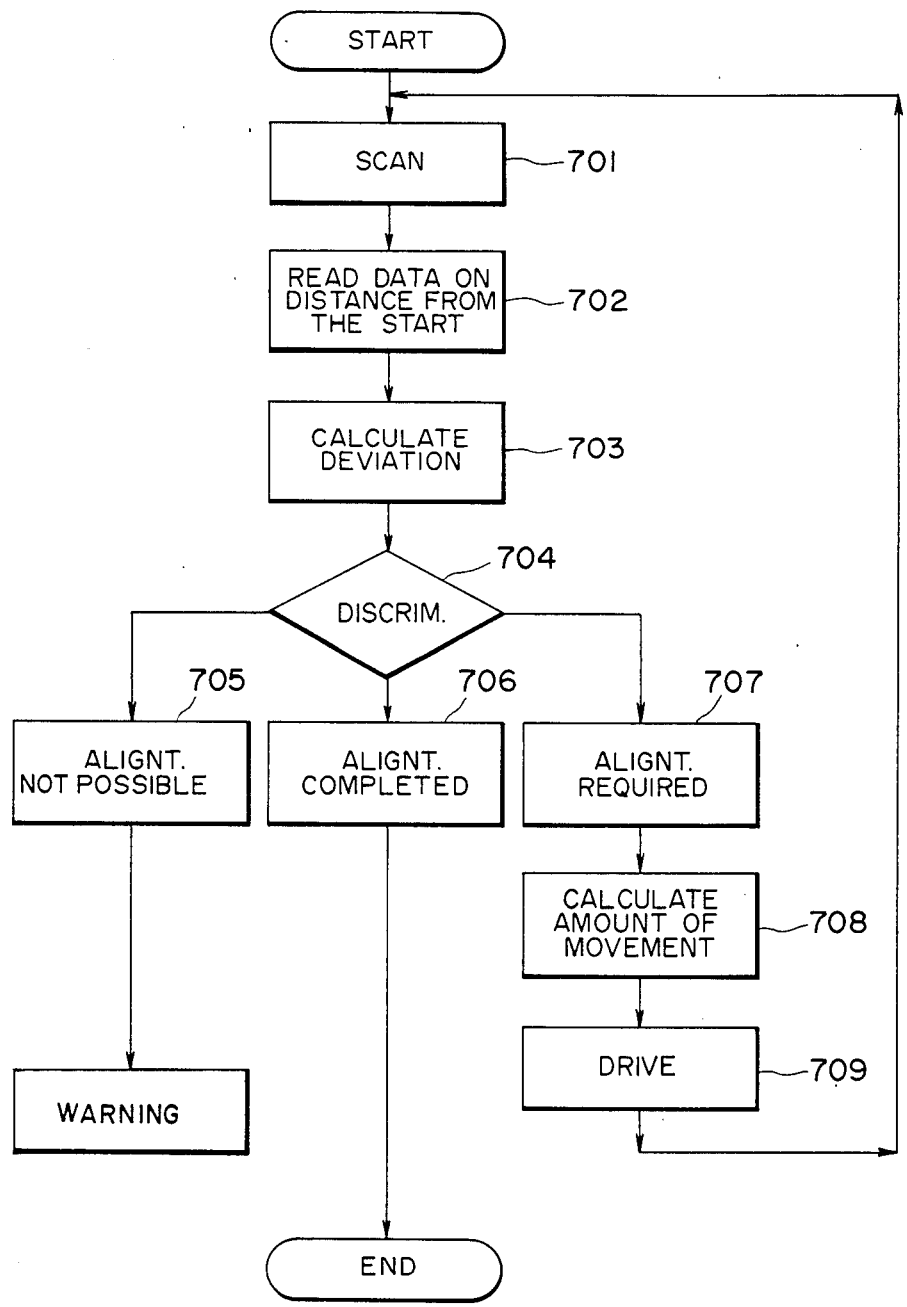
FIG. 7 is a flow chart showing the manner of alignment of an objective lens system, in accordance with one embodiment of the present invention.

FIG. 7 shows the flow of the above described process of the "objective" alignment.

First, at Step 701, the laser beam scanning is effected whereby output signals corresponding to the mask reference mark 80 (80') and the mask alignment mark 81 (81') are obtained. Second, at Step 702, the data on the distance of each of the output signals from the scan start point is read. Then, at Step 703, the amount of deviation of the objective lens system 82 (82') from the center of corresponding mask reference mark 80 (80') is measured.

Thereafter, at Step 704, the positional deviation of each of the objective lens systems 82 and 82' is graded in respect to the following three states:

(State 1) The objective lens system 82 (82') is immovable with respect to the $\theta$ direction. Thus, if the objective lens systems 82 and 82' have certain Y-axis deviations which are in the opposite directions, and if the relative deviation between these objective lens systems 82 and 82' is not tolerable, it is discriminated that the alignment of the objective lens systems 82 and 82' with the respective mask reference marks 80 and 80' is not possible. Also, if an extraordinarily large amount of deviation is contained in the X direction, it is also discriminated that the "objective" alignment is not possible.

(State 2) If each of the objective lens systems 82 and 82' has a positional deviation of such amount, with respect to the X and Y directions, that is within a tolerance, it is discriminated that both the objective lens systems 82 and 82' are in alignment with the centers of the respective mask reference marks 80 and 80'.

(State 3) This is one other than the above described states (1) and (2). That is, the "objective" alignment is not yet achieved and correcting movement of the objective lens system is necessary and possible.

If the alignment is not possible (Step 705) in the case of the State 1, the sequence proceeds to Step 710 at which a warning is given to an operator. If it is discriminated that the alignment is completed (Step 706), the "objective" alignment operation is finished. If it is discriminated that the alignment is required (Step 707) in the case of the State 3, the sequence proceeds to Step 708 at which the amount of correcting movement of each of the objective lens systems 82 and 82' with respect to each of the X direction and Y direction is calculated. Then, at Step 709, the actual correcting movement of the objective lens system is effected. Then, for confirmation, the sequence turns back to the Step 701 so that the laser beam scanning and various operations following the laser beam scanning are repeated, until the positional deviation comes into the range of tolerance.

While, in the foregoing embodiments, the detection of the position of the objective lens system relative to the mask reference mark is performed on the basis of the measured values of a and b (in FIG. 5A) and of the preset values of A and L, the invention is not limited. For example, the position of the objective lens system can be detected from the intervals between the point S and the position S71 (see FIGS. 5A and 5B), between the positions S71 and S72, between the positions S72 and S73, between the positions S73 and S74 and between the position S74 and the scan end point. Further, the distance from the position S72 to the position S73 may be compared with a preset value, or, as a further alternative, the distance b (FIG. 5A) may be compared with a preset value.

In the foregoing embodiments, the position of the objective lens system is adjusted or corrected, after the detection thereof with respect to the reference position, so that the objective lens system is actually brought into correct alignment with the reference position. However, the invention is not limited thereto. The positional deviation of the objective lens system with respect to its reference position can be corrected by, during movement of the objective lens system toward the mask-to-wafer alignment detection position, controlling the amount of the movement in the X and Y directions in accordance with the detected coordinative position of the objective lens system with respect to its reference position.

In accordance with the present invention, as has hitherto been described, there is provided an alignment system in which the alignment of two objects is carried out through an observation optical system having an objective lens system and in which the objective lens system can be positioned accurately and quickly. The capability of accurate position control for the objective lens system is particularly effective for a case where the objective lens system itself must be moved because of its narrow field of view, a lower driving speed of the object or objects which are the subject of observation, etc.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for aligning a first member with a second member, while using a mark formed on the first member and a mark formed on the second member, said apparatus comprising:

means for carrying a reference mark independently from the first and second members;

means for observing the mark on the first member and the mark on the second member, said observing means being movable to a position for observing the marks on the first and second members; and means for aligning said observing means with respect to a reference position which acts as a reference point for the movement of said observing means to the position for observing the marks on the first and second members, said aligning means aligning said observing means on the basis of the observation of said reference mark by said observing means.

2. An apparatus according to claim 1, wherein said aligning means is further operable to align the first and second members with each other on the basis of the observation of the marks on the first and second members by said observing means.

3. An apparatus according to claim 1, wherein said observing means scans said reference mark with a beam.

4. An apparatus according to claim 3, wherein said aligning means detects the reference position of said observing means on the basis of information on a scan length between a start point of the beam scan and a point at which the scan beam intersects said reference mark.

5. An apparatus according to claim 1, wherein said carrying means includes an optical system for projecting an image of the first member onto the second member.

6. An apparatus according to claim 5, wherein said aligning means is adapted to act on said observing means to cause it to observe the mark on the first member and the mark on the second member to detect a positional relation between the first and second members determined through said projecting optical system.

7. An apparatus according to claim 1, further comprising means for relatively positioning said reference mark, carried by said carrying means, within a field of said observing means.

8. An apparatus according to claim 7, wherein said positioning means includes a plurality of photosensors.

9. An alignment apparatus for bringing a first member and a second member into a predetermined positional relation by use of alignment marks provided on the first and second members, said apparatus comprising:
a movable objective lens system;
a reference mark provided independently of the first and second members; and
aligning means for detecting the alignment marks of the first and second members by use of light passed through said objective lens system and for bringing the first and second members into the predetermined positional relation in accordance with the detection of the alignment marks, said aligning means further being operable to detect said reference mark by use of light passed through said objective lens system and, in accordance with the detection of said reference mark, to set said objective lens system with respect to a reference position for movement thereof.

10. An apparatus according to claim 9, wherein said apparatus is usable with a projection optical system for optically projecting a pattern formed on the first member upon the second member, and wherein the reference mark is formed on a member which is provided as a unit with the projection optical system.

11. An alignment apparatus for bringing a first member and a second member into a predetermined positional relation by use of alignment marks provided on the first and second members, said apparatus comprising:
an objective lens system capable of detecting the alignment marks of the first and second members;
a reference mark provided independently of the first and second members;
a light source for producing a light beam defining an illuminated region; and
detecting means for detecting said reference mark by use of the light beam produced by said light source and passed through said objective lens system, and for detecting deviation of the illuminated region with respect to a predetermined reference position in accordance with the detection of said reference mark.

12. An alignment apparatus for bringing a first member and a second member into a predetermined positional relation with each other, said apparatus comprising:
a movable objective lens system;
a reference mark provided independently of the first and second members; and
aligning means for detecting said reference mark by use of light passed through said objective lens system and, in accordance with the detection, for setting said objective lens system with respect to a reference position for movement thereof, so as to detect the positional relation between the first and second members.

13. An alignment apparatus for bringing a first member having a first alignment mark into a predetermined positional relation with a second member having a second alignment mark, said apparatus comprising:
a movable objective lens system;
a reference mark provided independently of the first and second members; and
aligning means for detecting the first alignment by use of said objective lens system, and for setting the first member with respect to a predetermined position in accordance with the detection for the first alignment mark, said aligning means further being operable to detect said reference mark by use of said objective lens system and, in accordance with the detection of said reference mark, to set said objective lens system with respect to a reference position upon movement of said objective lens system toward a position that allows detection of the second alignment mark, so as to align the first and second members.

* * * * *

UNITED STATES PATENT AND TRADEMARK OFFICE
CERTIFICATE OF CORRECTION

PATENT NO. : 4,801,808
DATED : January 31, 1989
INVENTOR(S) : BUNEI HAMASAKI

It is certified that error appears in the above-identified patent and that said Letters Patent is hereby corrected as shown below:

COLUMN 2

Line 13, ". It" should read --. ¶ It--.

COLUMN 3

Line 33, "stage" should read --stage 5--.

COLUMN 4

Line 1, "FIGURE" should read --Figure--.

COLUMN 5

Line 49, "in a" should read --in an-- and "direction(" should read --direction--.

COLUMN 6

Line 12, "of" should be deleted.
    Line 20, "such a" should read --such--.
    Line 35, "Figure." should read --Figure,--.

COLUMN 7

Line 39, "be of" should read --be of a-- and "that of a" should read --that of the--.

UNITED STATES PATENT AND TRADEMARK OFFICE
CERTIFICATE OF CORRECTION

PATENT NO. : 4,801,808
DATED : January 31, 1989
INVENTOR(S) : BUNEI HAMASAKI

Page 2 of 2

It is certified that error appears in the above-identified patent and that said Letters Patent is hereby corrected as shown below:

COLUMN 9

Line 62, "character M" should read --character a--.
    Line 66, "distance M" should read --distance a--.

COLUMN 10

Line 8, "distance M" should read --distance a--.

COLUMN 12

Line 1, "limited." should read --limited thereto.--.

Signed and Sealed this

Seventeenth Day of April, 1990

Attest:

HARRY F. MANBECK, JR.

*Attesting Officer*  *Commissioner of Patents and Trademarks*